US012703100B2

(12) United States Patent
Irnstetter et al.

(10) Patent No.: US 12,703,100 B2
(45) Date of Patent: Aug. 11, 2026

(54) INTERCHANGEABLE-OBJECT HOLDING APPARATUS AND METHOD FOR AN EUV METROLOGY SYSTEM

(71) Applicant: Carl Zeiss SMT GmbH, Oberkochen (DE)

(72) Inventors: Johann Irnstetter, Heidenheim an der Brenz (DE); Thomas Gebhard, Aalen (DE); Marcel Vogt, Langenau (DE); Andreas Daubenschüz, Drackenstein (DE); Manuel Best, Niederstotzingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 280 days.

(21) Appl. No.: 18/532,074

(22) Filed: Dec. 7, 2023

(65) Prior Publication Data

US 2024/0198533 A1 Jun. 20, 2024

(30) Foreign Application Priority Data

Dec. 15, 2022 (DE) ......................... 102022213714.0

(51) Int. Cl.
*B25J 9/16* (2006.01)
*G03F 7/00* (2006.01)

(52) U.S. Cl.
CPC ........ *B25J 9/1692* (2013.01); *G03F 7/70625* (2013.01); *G03F 7/706845* (2023.05)

(58) Field of Classification Search
None
See application file for complete search history.

(56) References Cited

U.S. PATENT DOCUMENTS

2010/0066990 A1 3/2010 Bieg et al.
2010/0241384 A1 9/2010 Huebel et al.
(Continued)

FOREIGN PATENT DOCUMENTS

CN 106024506 10/2016
DE 102011111372 10/2012
(Continued)

OTHER PUBLICATIONS

Office Action issued by the German Patent Office for Application No. DE 10 2022 213 714.0, dated Aug. 3, 2023 (with English Translation).

(Continued)

*Primary Examiner* — Eric S. McCall
*Assistant Examiner* — Nigel H Plumb
(74) *Attorney, Agent, or Firm* — Fish & Richardson P.C.

(57) ABSTRACT

An interchangeable-object holding apparatus for an EUV metrology system for holding and providing an interchangeable object, which is intended to be used interchangeably within the EUV metrology system. A calibration device serves for calibrating a relative position of the interchangeable object in the interchangeable-object holder with respect to a calibration object of the interchangeable-object holding apparatus. The calibration device has holder abutment bodies, secured to the interchangeable-object holder, and calibration-object counter-abutment bodies, secured to the calibration object. At least one contact sensor of the calibration device serves for detecting a contact between the respective holder abutment body and the respective calibration-object counter-abutment body. An evaluation unit serves for determining the relative position of the interchangeable object in the interchangeable-object holder with respect to the calibration object, enabling the interchangeable-object holder to be positioned relative to the calibration object with a specified level of accuracy and with less metrological complexity of the calibration device.

21 Claims, 8 Drawing Sheets

(56) References Cited

U.S. PATENT DOCUMENTS

| | | | | |
|---|---|---|---|---|
| 2015/0202774 | A1* | 7/2015 | Blank | H01L 21/673<br>700/254 |
| 2015/0277241 | A1 | 10/2015 | Valentin et al. | |
| 2021/0098276 | A1* | 4/2021 | Moura | H01L 21/68 |
| 2022/0236648 | A1 | 7/2022 | Capelli et al. | |

FOREIGN PATENT DOCUMENTS

| | | | |
|---|---|---|---|
| DE | 102015204521 | * | 10/2016 |
| DE | 102009016858 | | 11/2017 |
| DE | 102019215799 | | 4/2021 |
| KR | 1020090125096 | | 12/2009 |
| KR | 1020150079785 | | 7/2015 |
| KR | 1020150088207 | A | 7/2015 |
| KR | 1020220075906 | | 6/2022 |
| KR | 1020220079981 | | 6/2022 |

OTHER PUBLICATIONS

Office Action issued by the Korean Patent Office for Application No. KR 10-2023-0178713, dated Jun. 4, 2025 (with English Translation).

Office Action in Korean Appln. No. 10-2023-0178713, mailed on Feb. 24, 2026, 17 pages (with English translation).

* cited by examiner

INTERCHANGEABLE-OBJECT HOLDING APPARATUS AND METHOD FOR AN EUV METROLOGY SYSTEM

CROSS-REFERENCE TO RELATED APPLICATION

The present patent application claims the priority of German patent application DE 10 2022 213 714.0, the content of which is incorporated herein by reference.

TECHNICAL FIELD

The invention relates to an interchangeable-object holding apparatus for an EUV metrology system for holding an interchangeable object that is to be used interchangeably within the EUV metrology system. The invention further relates to a method for calibrating such an interchangeable-object holding apparatus using a calibration device. The invention further relates to a metrology system having such an interchangeable-object holding apparatus.

BACKGROUND

An EUV metrology system having at least one interchangeable-object holding apparatus for holding an interchangeable object, for example a lithography mask to be measured, is known on the market. An interchangeable-object holding apparatus that can be used in an EUV metrology system is known from DE 10 2019 215 799 A1. Metrology systems for measuring in particular lithography masks are furthermore known from DE 10 2011 111 372 A1 and DE 10 2009 016 858 B4. US 2021/0 098 276 A1 discloses a tool auto-teach method and a tool auto-teach apparatus. US 2015/0 202 774 A1 discloses a touch auto-calibration of process modules. DE 10 2015 204 521 A1 discloses a cleaning method for an EUV lithographic system.

SUMMARY

It is an aspect of the present invention to further develop an interchangeable-object holding apparatus of the type mentioned in the introductory part in a way such that an interchangeable-object holder can be positioned relative to a calibration object of the interchangeable-object holding apparatus with a specified level of accuracy, in particular with an accuracy of at least 250 μm, and with less metrological complexity of the calibration device compared with the prior art.

This aspect is achieved according to the invention by an interchangeable-object holding apparatus having the features specified in claim 1.

It has been found, according to the invention, that, instead of an optical calibration, a sufficiently accurate calibration of a relative position of the interchangeable-object holder with respect to the calibration object is possible by tactile probing via the abutment bodies by detecting a contact between the mutually contacting abutment bodies. The contact between the holder abutment body and the calibration-object counter-abutment body can be detected by use of a contact sensor, which can be designed as a force sensor. Such force sensor may include a power measurement unit. It in particular may include a coil power measurement unit to measure a current through at least one coil of an actuator, in particular of a Lorentz actuator. Alternatively, the force sensor may be embodied as a wheatstone bridge, as a capacitive load cell or as a piezoelectric load cell. The contact or force sensor may comprise a measurement unit for measuring a power consumed by the holder abutment body. With such a force sensor it is possible to measure a force with which the holder abutment body rests against the calibration-object counter-abutment body. Alternatively or additionally it is possible to detect the contact by way of a target/actual comparison of operating parameters of a distance measurement system of the calibration device, via which system positions of the holder abutment body or of the calibration-object counter-abutment body are capturable. A corresponding distance measurement system can have at least one eddy-current sensor, wherein the operating or capture parameter can be an absolute value of the eddy current captured by way of sensor.

The respective contact sensor can be used to ensure a relative position of the interchangeable-object holder with respect to the calibration object and thus a position calibration also of the interchangeable object, which is held in the interchangeable-object holder, with respect to the calibration object. The abutment bodies and/or the counter-abutment bodies can be spherical in order to provide a defined contact. A typical radius of curvature of such a spherical embodiment can be greater than 10 mm. The embodiment of the calibration device with the abutment bodies makes it possible to avoid an optical sensor system for calibrating the relative position of the interchangeable-object holder with respect to the calibration object. This makes it possible in particular to dispense with line connections for supply lines for an optical sensor system within any sensitive vacuum chambers of the metrology system that may be present. If a material and/or shape of the abutment bodies is/are selected appropriately, it is possible to reliably prevent the generation of undesirable abrasion particles due to tactile probing to a sufficient degree.

Embodiments of the interchangeable-object holder according to claim 2 have a particular use in the practical use of EUV metrology systems because it is possible to ensure hereby a controlled interchange between measurement objects to be measured and/or a controlled adaptation of illumination and/or imaging parameters of an optical system of the metrology system via an exchange of an interchangeable stop. The stop to be held can be a stop for an illumination optical unit and/or a stop for a projection optical unit of the metrology system. A plurality of stop holders can be provided.

A power measurement according to claim 3 ensures an elegant implementation of a force sensor. In particular, a coil power of a coil of the electromagnetic holder drive can be measured.

The use of an end effector as a calibration object according to claim 4 has proven its worth in practice. The components of the metrology system that interact with one another in a position-critical manner during operation of the metrology system are calibrated with respect to their relative position to one another. Reliable handling of interchangeable measurement objects or interchangeable stops is the consequence. Unnecessary component collisions are avoided. A reliable interchangeable-object transfer/pickup is also the consequence after a prolonged shutdown or unusual operational circumstances to which the EUV metrology system is exposed. The mechatronic position system can be an industrial robot.

A plurality of holder abutment bodies according to claim 5 and/or a plurality of calibration-object counter-abutment bodies increase an accuracy or reliability in the determination of relative positions during calibration. A relative-position calibration along a plurality of position coordinates is possible.

A holder abutment body and/or a calibration-object counter-abutment body according to claim 6 enables a measurement in the case of a translation displacement along a plurality of degrees of freedom. This simplifies the design of the calibration device.

It is a further aspect of the invention to specify a calibration method using such an interchangeable-object holding apparatus, with which a relative-position calibration in respect of at least one translational degree of freedom is possible.

This aspect is achieved according to the invention by a calibration method comprising the steps specified in claim 7.

By producing a defined first contact relative position by way of a corresponding translational displacement of the interchangeable-object holder relative to the calibration object, an exact relative-position determination becomes accessible along the displacement degree of freedom. This calibration method including the position data evaluation may optionally be carried out multiple times, wherein defined mounting changes of the interchangeable-object holder relative to the calibration object, which are defined between the repetitions of the method, can be carried out along other ones of the degrees of freedom of the translation/rotation. In this way, a position data set is obtained which also enables a pose calibration of the interchangeable-object holder relative to the calibration object over a plurality of translational/rotational degrees of freedom.

In a method according to claim 8, a corresponding piece of calibration data information about the second translational degree of freedom is obtained. Here too multiple repetition of interposed further displacements of the interchangeable-object holder and/or of the calibration object along a further translational/rotational degree of freedom is possible in order to additionally obtain the position data for the calibration. A displacement of the interchangeable-object holder relative to the calibration object along the third translational degree of freedom with a corresponding capture of contact-sensor data and evaluation of the position data is also possible, with the result that a calibration over all three spatial coordinates is accessible. The contact-sensor data can be force-sensor data.

In the method according to claim 9, a procedure of the method is possible in which even in the case of a translation of the interchangeable-object holder relative to the calibration object along only one degree of freedom, a determination of the relative position to be calibrated in two translational degrees of freedom is accessible. The rotational displacement evaluated with respect to the change in position makes this possible.

A step-by-step displacement, in particular a step-by-step translational displacement, during the performance of the calibration method according to claim 10 enables a highly precise approaching movement to the respective defined contact relative position. As an alternative of a step-by-step displacement, it is also possible to carry out a continuous displacement, in particular comparable with a coordinate measuring machine having a probe head.

This applies, in particular, to a displacement according to claim 11. To reach the defined contact relative position, a displacement step sequence can be used in which, after a step in the direction of the respective translational degree of freedom, a step, in particular having a smaller step width, in the opposite direction of the respective translational degree of freedom takes place. By measuring in particular the power consumed by the holder drive during a displacement, it is possible to obtain exact information about the presence of a respective defined contact relative position during such displacement step sequences.

The advantages of a metrology system according to claim 12 correspond to those that have already been explained above with reference to the interchangeable-object holding apparatus. The metrology system can be embodied such that a calibration method as explained above can be carried out thereby.

An EUV metrology system having at least one industrial robot according to claim 13 enables a controlled interchange of interchangeable objects, in particular of lithography masks to be measured, or of stops to be used in an optical system of the metrology system 1.

BRIEF DESCRIPTION OF DRAWINGS

Exemplary embodiments of the invention are explained in more detail below with reference to the drawings, in which.

DETAILED DESCRIPTION

Figure 1:
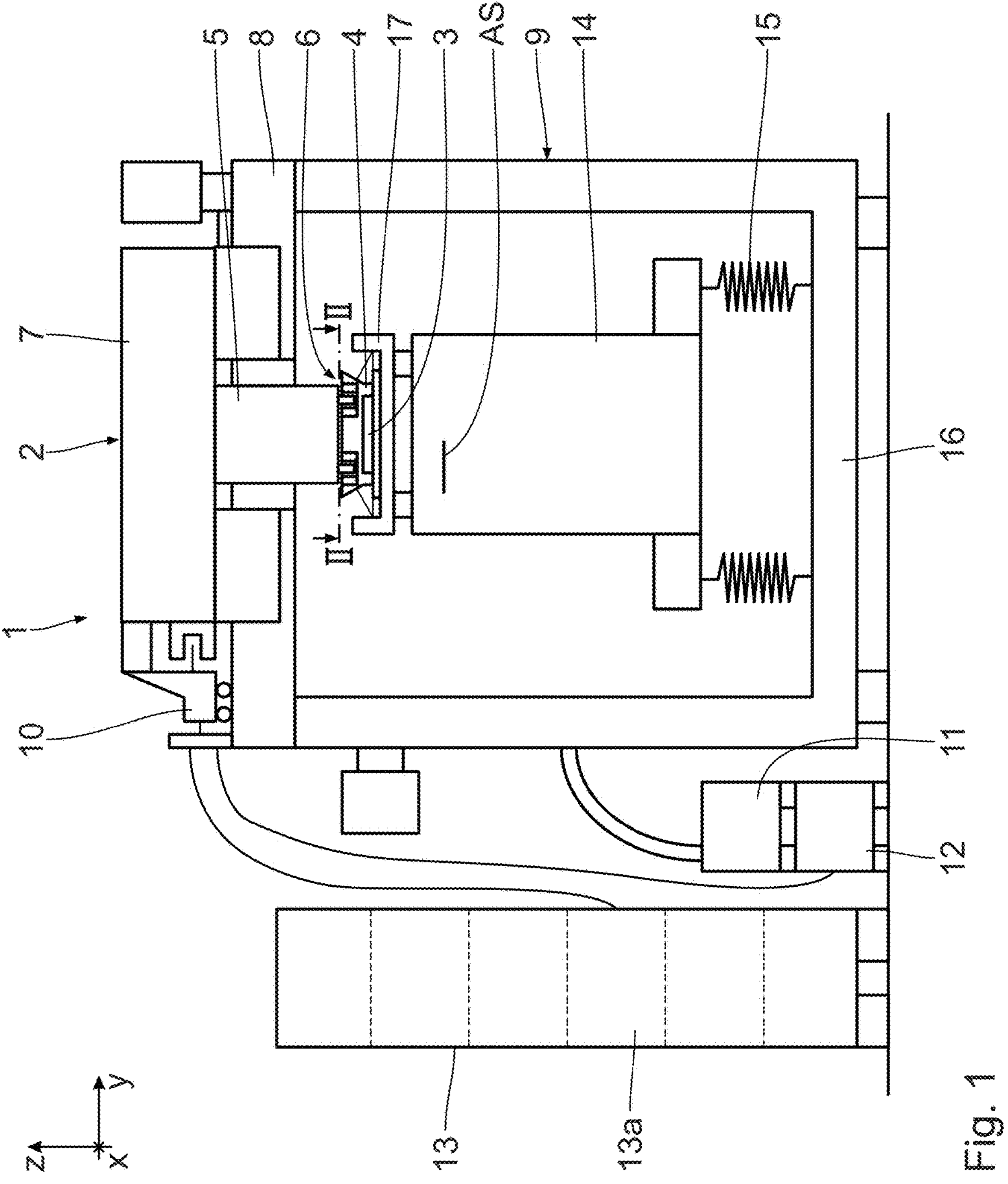
FIG. 1 schematically illustrates main components of an EUV metrology system for measuring a measurement object in the form of a lithography mask.

FIG. 1 schematically shows main components of an EUV metrology system 1.

In order to facilitate the description of positional relationships, a Cartesian xyz-coordinate system is used hereinafter. The x-direction extends perpendicular to the plane of the drawing out of the latter in FIG. 1. The y-direction extends toward the right in FIG. 1. The z-direction extends toward the top in FIG. 1.

The EUV metrology system 1 has, as an interchangeable-object holding apparatus, a measurement-object holding apparatus 2 for a measurement object 3 in the form of a lithography mask, which is also referred to as a reticle. The reticle 3 is held in a measurement-object holder 4, which is displaceable relative to a holding column 5 by use of a fine-adjustment holder drive 6 in the three degrees of freedom x, y, z of the translation and by at least one of the rotational degrees of freedom dx, dy and dz.

The fine-adjustment holder drive 6 can have a plurality of magnet/coil pairs, which can be designed as Lorentz actuators. Six such magnet/coil pairs may be present, for example.

The measurement-object holder 4 is made from a material having a very small coefficient of thermal expansion, such as from Zerodur or from ULE.

FIG. 1 shows the metrology system 1 in a schematically partially sectioned side view. The holding column 5 is fixedly connected to a holding block 7. The holding block 7 is supported on a cover plate 8 of a main vacuum chamber 9 of the metrology system 1. The holding block 7 is displaceable relative to the cover plate 8 via a coarse-adjustment holder drive 10 again in the three translational degrees of freedom x, y, z and by at least one of the rotational degrees of freedom dx, dy and dz.

The holding block 7 being supported on the cover plate 8 can be a pneumatic bearing.

To generate a vacuum in the main vacuum chamber 9, a vacuum system 11 is used. To create defined temperature conditions for the measurement object in the measurement-object holder 4, a cooling system 12 is used.

An open-loop/closed-loop control device 13 of the metrology system 1 is used to control drive, supply, sensor and evaluation units of the metrology system 1.

The metrology system 1 furthermore includes an optical system 14 for guiding EUV illumination and imaging light to an object field which covers a surface section of interest of the measurement object 3 (region of interest, ROI), and for imaging the object field into an image field, in which a spatially resolving detection device of the metrology system 1 is arranged. For example, the spatially resolving detection device can be a charge-coupled device (CCD) sensor or a complementary metal-oxide-semiconductor (CMOS) sensor. An illumination optical unit is used to guide the EUV illumination light into the object field, and a projection optical unit of the optical system 14 of the metrology system 1 is used to guide the EUV imaging light from the object field to the image field. For example, the illumination optical unit can include one or more lenses, and/or one or more reflection surfaces, and/or one or more optical filters that in combination guide the EUV imaging light. Similarly, the projection optical unit can include one or more lenses, and/or one or more reflection surfaces, and/or one or more optical filters that in combination guide the EUV imaging light. Examples of an illumination optical unit or of a projection optical unit to be used in a metrology system are known from DE 10 2019 215 799 A1, from DE 10 2011 111 372 A1 and from DE 10 2009 016 858 B4, and the entire contents of the above applications are incorporated by reference. The optical system 14 is supported on a base plate 16 of the main vacuum chamber 9 via an oscillation damping device 15.

The optical system 14 of the metrology system 1 furthermore includes a positioning apparatus 17 for specifying a relative position of the measurement-object holder 4 relative to the optical system 14. Details regarding this positioning apparatus 17 are known from DE 10 2011 111 372 A1.

The metrology system 1 furthermore includes a robot system. Part of this robot system, which includes at least one mechatronic positioning system and in particular at least one handling device, for example in the form of an industrial robot, is a robot arm via which the respective measurement object, that is to say the respective reticle 3, of the measurement-object holder 4 is feedable through airlock chambers (not illustrated) into the main vacuum chamber 9.

Figure 2:
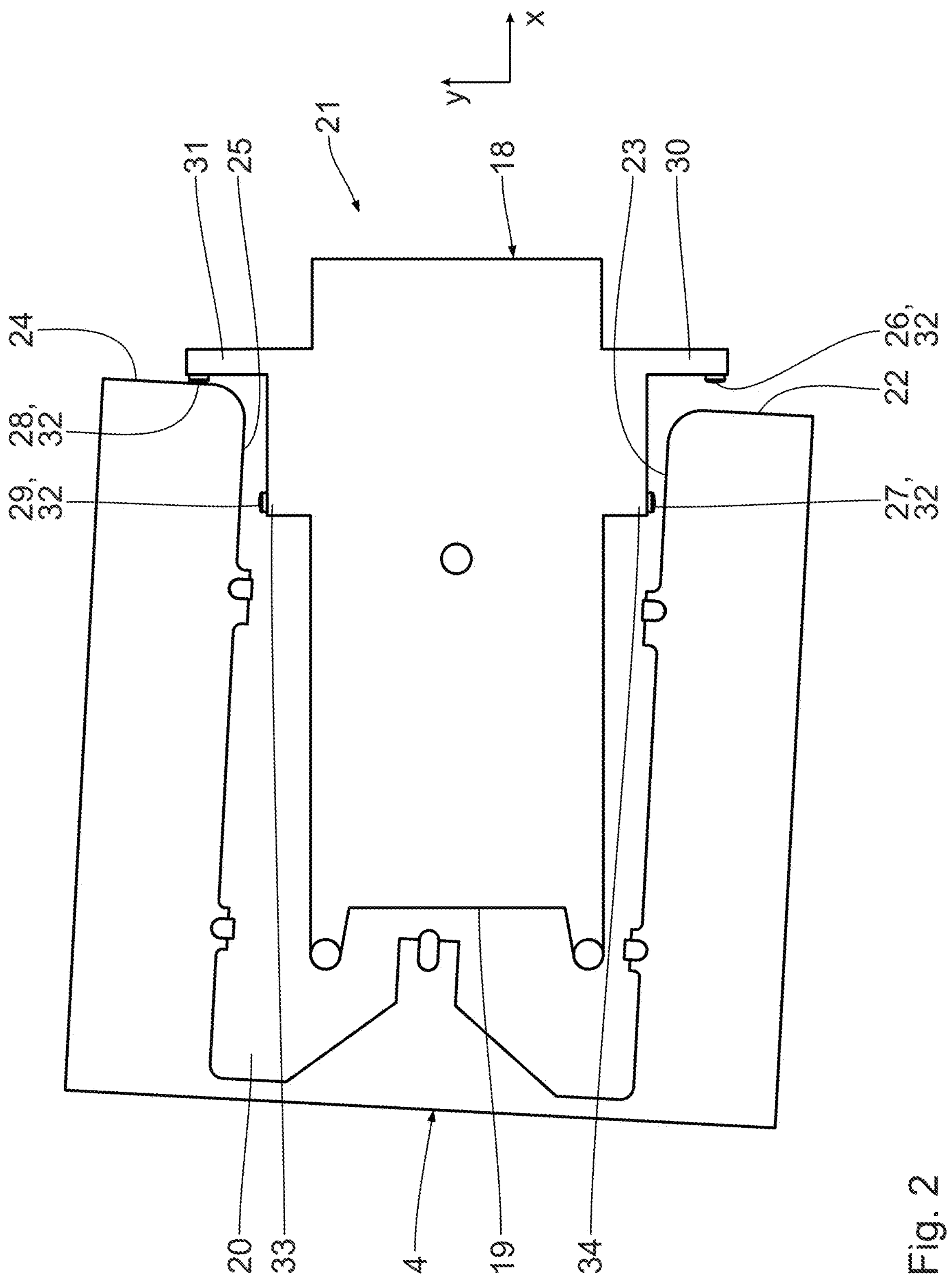
FIG. 2 shows a section through a measurement-object holding apparatus of the metrology system along the line II-II in FIG. 1, wherein also shown is an end effector of a measurement-object interchanging robot in a first contact relative position between a holder abutment body of a measurement-object holder of the measurement-object holding apparatus and a counter-abutment body of the measurement-object interchanging robot during a calibration method for specifying a measurement position of the measurement-object holding apparatus.

FIG. 2 shows, in a sectional illustration parallel to the xy-plane of FIG. 1, an end effector 18 of the robot arm for feeding the respective reticle 3, which is not illustrated in FIG. 2. In addition, FIG. 2 illustrates the measurement-object holder 4 in an xy-section.

FIG. 2 shows the end effector 18 in a first contact relative position relative to the measurement-object holder 4, in which a fork-type measurement-object holding section 19 of the end effector 18 is sunk into a corresponding holder receptacle 20 of the measurement-object holder 4. This first contact relative position according to FIG. 2 is an instantaneous position of a calibration method for calibrating the measurement-object holding apparatus with the measurement-object holder 4 relative to the robot arm with the end effector 18. This calibration method, which will be described in more detail below, is performed with a calibration device 21 of the metrology system 1.

This calibration device 21 includes a plurality of holder abutment bodies 22, 23, 24, 25 of the measurement-object holder 4. These holder abutment bodies 22 to 25 are designed as planar surface sections of the measurement-object holder 4, which each extend perpendicularly to the xy-plane.

The two holder abutment bodies 22 and 24 represent end-side surface sections of the measurement-object holder 4, which each terminate the holder receptacle 20 in the positive x-direction in FIG. 2.

The holder abutment bodies 23 and 25 represent leading surface sections of the holder receptacle 20 on the receptacle-entry side.

The holder receptacle 20 is substantially U-shaped in the cross section shown in FIG. 2, with the U opening in FIG. 2 towards the right, i.e. in the positive x-direction. The holder abutment bodies 22 and 23 are arranged at one of the two end legs of this U and the two further holder abutment bodies 24 and 25 are arranged at the other end leg of this U.

The calibration device 21 furthermore has calibration-object counter-abutment bodies 26 to 29, which are secured to the end effector 18, which serves as the calibration object of the calibration method.

The two calibration-object counter-abutment bodies 26 and 28 are mounted on cantilevers 30, 31 of the end effector 18 extending in the negative and in the positive y-direction and have spherical abutment surfaces 32, which have an effective direction in the negative x-direction.

The further calibration-object counter-abutment bodies 27 and 29 are arranged at further cantilevers 33, 34 of the end effector 18, which extend in the negative x-direction. Abutment surfaces 32 of the calibration-object counter-abutment bodies 27 and 29 are again spherical and have an effective direction in the positive y-direction (counter-abutment body 29) and in the negative y-direction (counter-abutment body 27).

The counter-abutment bodies 26 to 29 are made from plastic.

In the first contact relative position of the measurement-object holder 4 relative to the end effector 18, the holder abutment body 24 has reached a defined contact relative position with respect to the calibration-object counter-abutment body 28 of the end effector 18.

Figure 3:
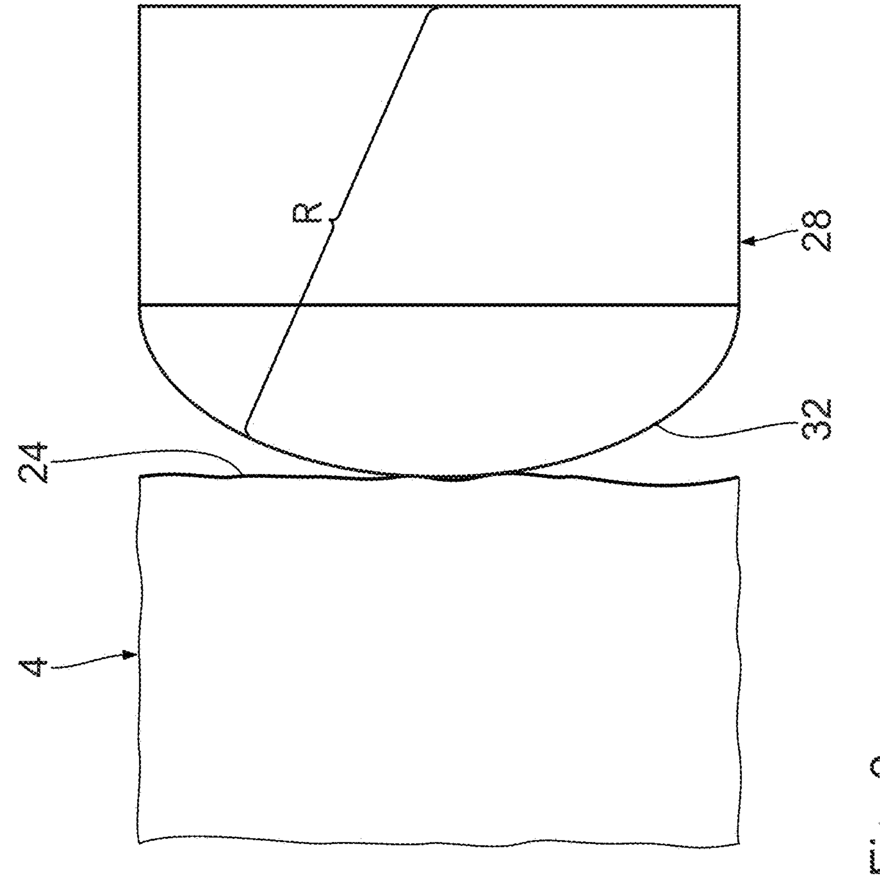
FIG. 3 shows, greatly enlarged compared with FIG. 2, the holder abutment body and, resting against it, the counter-abutment body of the interchanging robot in the contact relative position according to FIG. 2.

FIG. 3 shows great enlargement of this contact relative position. A radius of curvature R of the spherical abutment surface 32 is greater than 10 mm and can lie in the range between 15 mm and 100 mm.

An average roughness value of the abutment bodies 22 to 25 and also of the counter-abutment bodies 26 to 29 is smaller than 0.4 μm and can lie in the range between 0.02 and 0.35 μm.

Figure 4:
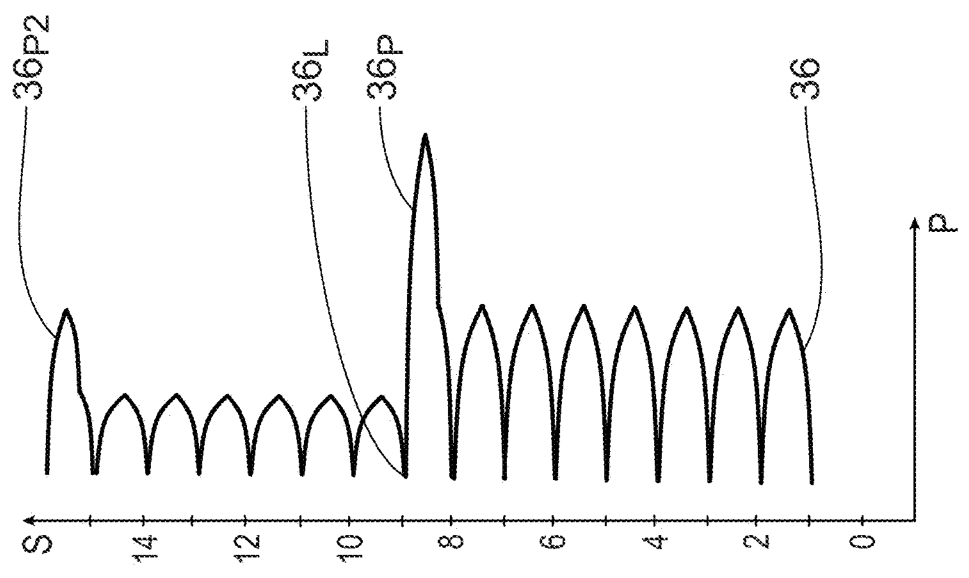
FIG. 4 shows diagrams of an approach progression (left) and a coil power of a displacement drive (right) of the measurement-object holder during the step-by-step reaching of the defined first contact relative position.
Figure 4:
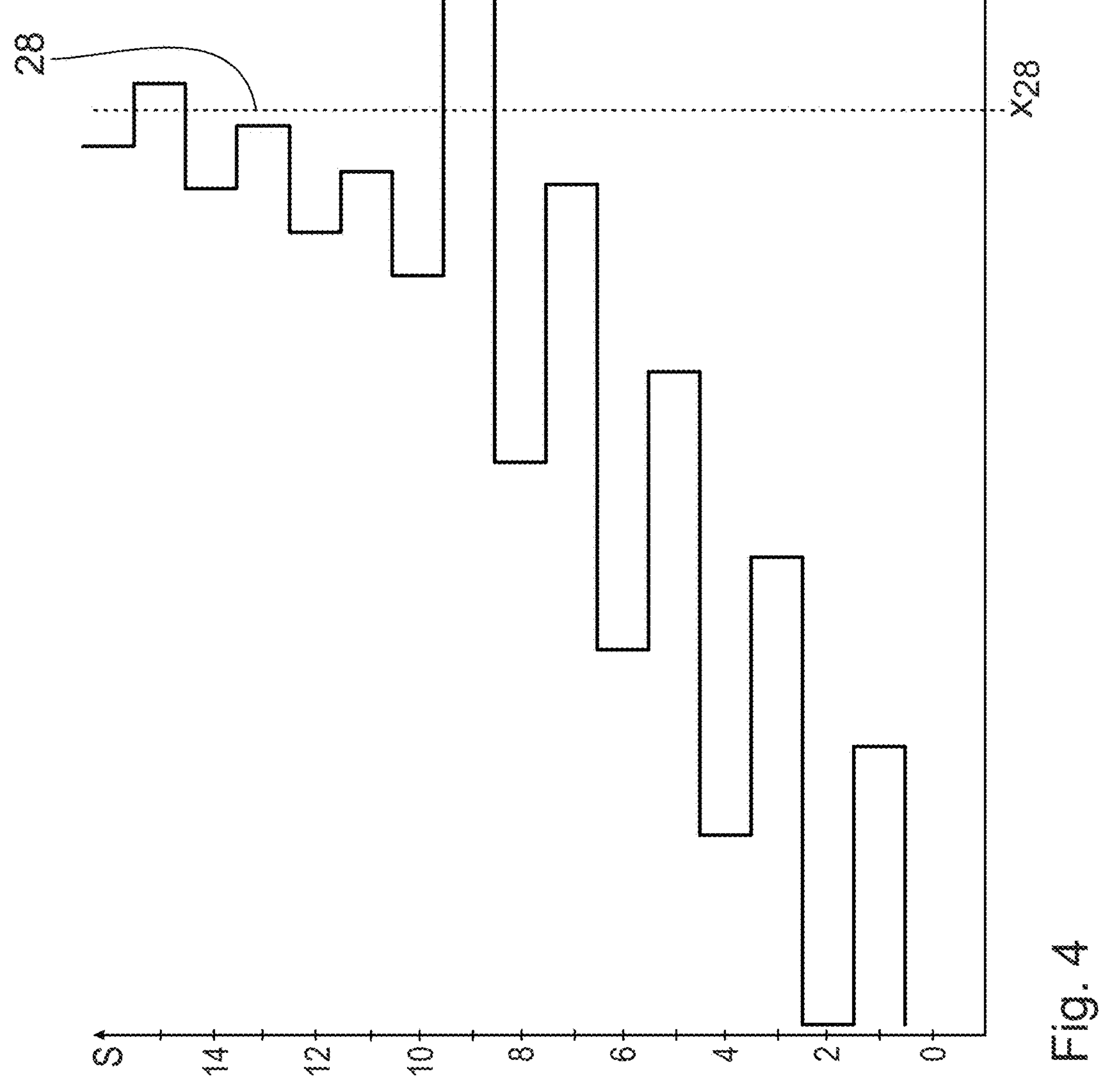

FIG. 4 illustrates in diagrams a step-by-step approaching method for reaching the defined contact relative position using the example of reaching the first contact relative position, illustrated in FIG. 2, between the holder abutment body 24 and the calibration-object counter-abutment body 28.

The left-hand diagram of FIG. 4 shows, towards the right, a displacement movement of the measurement-object holder 4 relative to the end effector 18 along the x-direction. A number of displacement steps S is plotted towards the top in this diagram. The diagram on the right in FIG. 4 shows, towards the right, a coil power P of the electromagnetically operating fine-adjustment holder drive 6 during the displacement of the measurement-object holder 4 relative to the end effector 18 in the x-direction in the respective displacement step S, also plotted towards the top in the diagram on the right in FIG. 4.

During the first nine steps S of this step-by-step approach for reaching the first contact relative position, the measurement-object holder 4 is moved in each case by 40 μm (only 20 μm in the first step) in the direction of the end effector 18 (steps 3, 5, 7 and 9), and moved back (steps 4, 6 and 8) inbetween again in the negative x-direction from the end effector 18 by 24 μm (only by 20 μm in the second step). During the first eight steps S, a power consumption 36 of the drive coil of the fine-adjustment holder drive 6 is in each case the same, as is shown in the diagram on the right in FIG. 4.

In the ninth step, during the approach in the positive x-direction, the holder abutment body 24 of the measurement-object holder 4 for the first time makes contact with the calibration-object counter-abutment body 28, whose exact x-position is marked by $x_{28}$ in the left-hand diagram of FIG. 4. This first contact results in a strong increase in the power consumption 36 of the drive coil of the fine-adjustment holder drive 6 up to a power peak $\mathbf{36}_P$. The respective coil power including in particular the power peak $\mathbf{36}_P$ is measured by a measurement unit of the fine-adjustment holder drive 6. This power measurement unit represents a contact sensor and in particular a force sensor of the calibration device 21, by which a force with which the respective holder abutment body 22 to 25 rests against the respective calibration-object counter-abutment body 26 to 29 can be measured. Such a measurement unit 13*a* as a constituent part of the open-loop/closed-loop control device 13 of the metrology system 1 is illustrated in FIG. 1.

The open-loop/closed-loop control device 13 evaluates the power data from the measurement unit of the calibration device 21, which is to say represents an evaluation unit of the measurement-object holding apparatus and thus of the metrology system 1.

After the measurement-object holder 4 has been displaced back in the subsequent step 10, again by 24 μm, the power consumption 36, which can be measured with the measurement unit, drops again to a normal minimum value 36L, such that an evaluation of the power data made available by the measurement unit of the calibration device 21 indicates that the holder abutment body 24 has once again come free of the calibration-object counter-abutment body 28.

In the next displacement step, the measurement-object holder 4 is additionally displaced by an increment that has been reduced to 14 μm in the positive x-direction towards the end effector 18. Next, the measurement-object holder 4 is withdrawn by an increment, which is likewise reduced, of 8 μm in the negative x-direction.

This sequence "14 μm towards/8 μm back" continues until, after step 15, another increase in the power consumption 36 to a further power peak 36*p*2 is measured.

Once the withdrawal by the increment of 8 μm has been completed, after the power consumption minimum 36L has been reached again with an accuracy of +/−5 μm, the defined contact relative position between the holder abutment body 24 and the calibration-object counter-abutment body 28 is reached, with the result that a first position calibration of the x-translational degree of freedom of the measurement object holder 4 to the end effector 18 can take place. The x-position of the measurement object holder 4 after this step 15 is evaluated and stored as an x-position datum during the calibration method.

After the first contact relative position has been reached and the position data thereof have been evaluated, the measurement-object holder 4 is displaced again away from the end effector 18 in a defined manner in the negative x-direction so that all holder abutment bodies 22 to 25 come free of the calibration-object counter-abutment bodies 26 to 29 that are assigned to them.

Subsequently, a defined rotational displacement of the measurement-object holder 4 relative to the end effector 18 takes place by way of pivoting the measurement-object holder 4 in FIG. 2 counterclockwise about a dz-increment.

This pivoting step is also referred to as rotational displacement within the framework of the calibration method. The change in position of the measurement-object holder 4 taking place during the rotational displacement is evaluated by capturing corresponding signal data of the fine-adjustment holder drive 6.

In the correspondingly rotationally displaced position of the measurement-object holder 4 relative to the end effector 18, the measurement-object holder 4 again approaches the end effector 18 step-by-step along the x-direction, as has already been explained with reference to FIG. 4 above.

Figure 5:
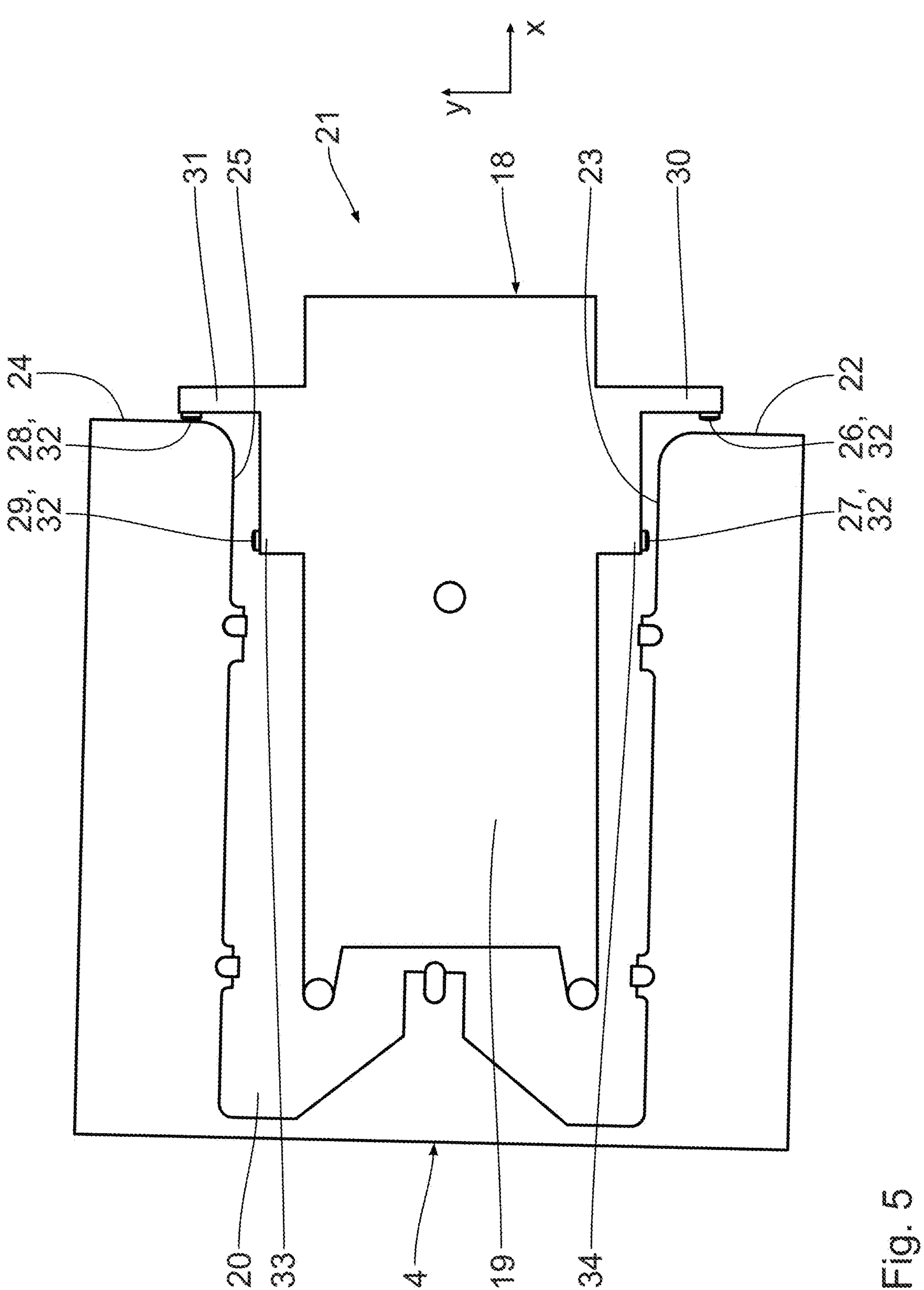
FIG. 5 shows in an illustration similar to FIG. 2 the measurement-object holder and the end effector in a second contact relative position of the calibration method, wherein, in comparison with the first contact relative position according to FIG. 2, the measurement-object holder has been displaced by a corresponding rotational degree of freedom clockwise according to FIG. 2 by one increment.

Due to the rotational displacement that has taken place, the resultant second contact relative position according to FIG. 5 and the x-coordinate of the holder abutment body 24, resulting during the evaluation of this second contact relative position, together with the position data of the first contact relative position and the rotational displacement, are a measure with which an exact xy-relative position of the measurement-object holder 4 with respect to the end effector 18 can be determined and calibrated.

The optical system 14 of the metrology system 1 furthermore includes stops for specifying an illumination angular distribution of the illumination light during the illumination of the object field and also for specifying an object-side numerical aperture of the projection optical unit of the optical system 14.

Figure 6:
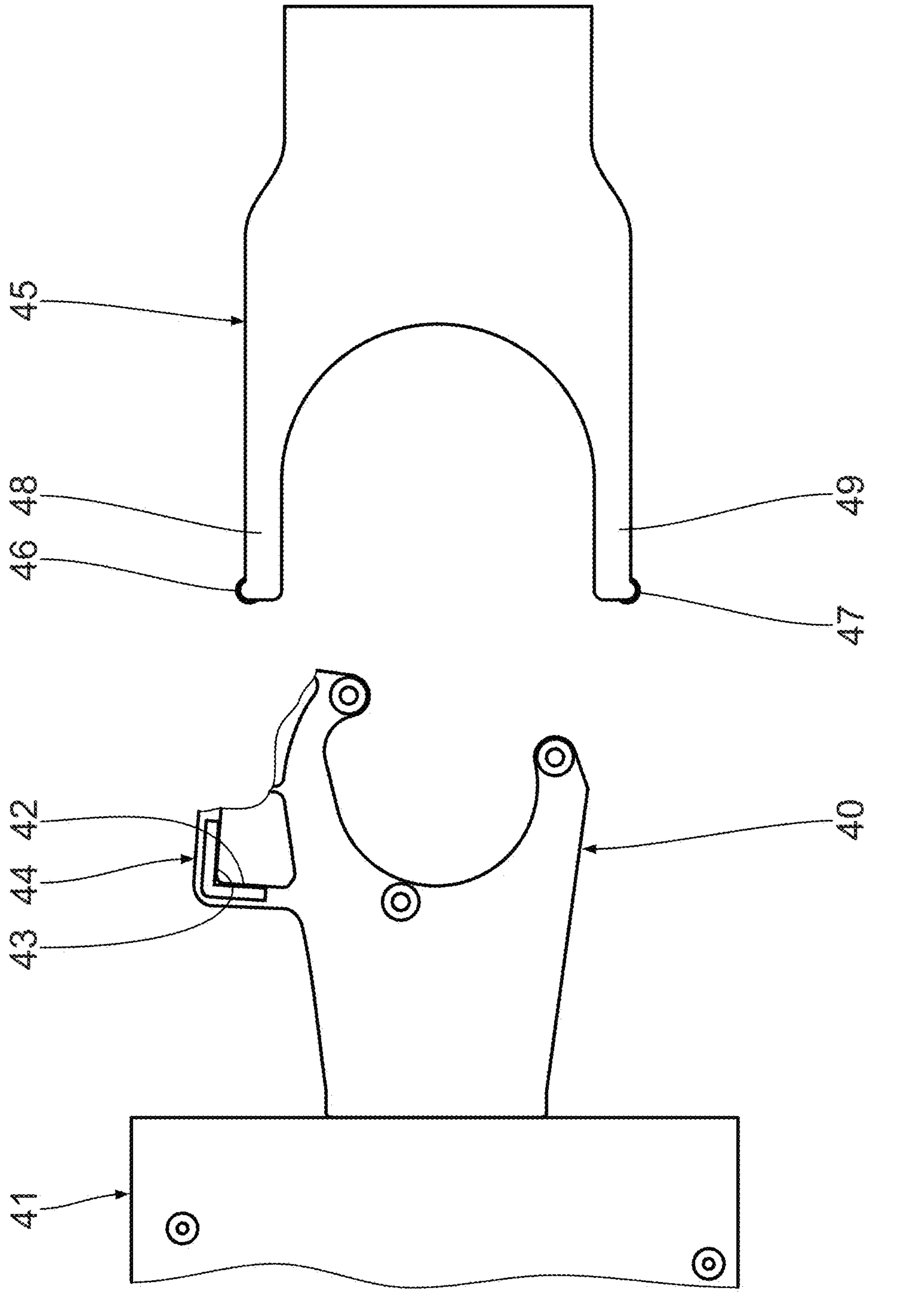
FIG. 6 shows, in a top view corresponding to FIGS. 2 and 5, a stop holder as a constituent part of a further embodiment of an interchangeable-object holding apparatus for the EUV metrology system together with an end effector of a stop interchanging robot, both shown in a starting position.

FIG. 6 shows a stop holder 40 for such a stop of the optical system 14, which is not illustrated in the drawing.

The position of such a stop AS in the optical system 14 is indicated schematically in FIG. 1.

The stop holder 40 is displaced via a stop holder drive 41 and is displaceable via the latter along at least two of the translational degrees of freedom x, y, z, specifically along the translational degrees of freedom x and y, possibly also along the translational degree of freedom z. The stop holder drive 41, in turn, is an electromagnetic holder drive, whose coil power can be measured with a measurement unit according to the explanation stated previously in connection with the fine-adjustment holder drive 6, with the measurement unit then in turn representing a contact sensor and in particular a force sensor of the calibration device 21.

The stop holder 40 in turn has holder abutment bodies 42, 43, which are designed as surface sections of a girder cantilever 44 of the stop holder 40. The surface section of the holder abutment body 42 extends substantially in the yz-plane, and the surface section of the holder abutment body 43 extends substantially in the xz-plane.

For interchanging the respective stop, an end effector 45 of a robot arm of an industrial robot of the metrology system 1 is used again. This stop transfer end effector or stop end effector 45 is used to transfer the stop to be used, which is selected from a corresponding stop magazine, to the stop holder 40.

The stop end effector 45, which for its part represents a calibration object of a calibration method corresponding to the previously described calibration method, has for its part two calibration-object counter-abutment bodies 46, 47, which are mounted on ends of two arm-type cantilevers 48, 49 of the stop end effector 45. The calibration-object counter-abutment body 46 is arranged here at the cantilever 48 such that it can capture both an approach in an x-relative displacement towards the holder abutment body 42 and also an approach in a y-relative displacement towards the holder abutment body 43. A similar approach applies to the calibration-object counter-abutment body 47.

Figure 7:
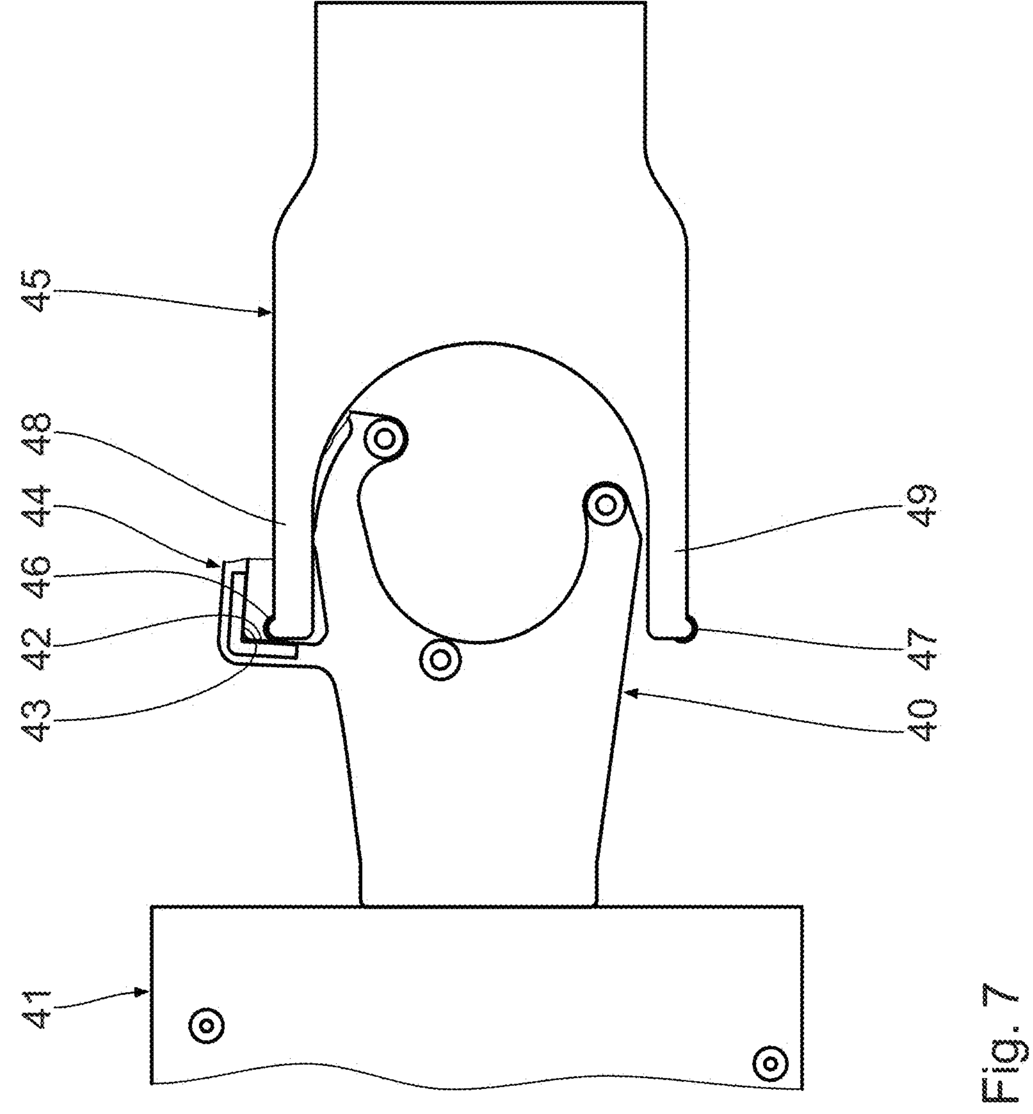
FIG. 7 shows in an illustration similar to FIG. 6 the stop end effector and the stop holder in a first contact relative position between a holder abutment body of the stop holder and a counter-abutment body of the stop end effector, which represents a calibration object, again during the performance of the calibration method.

FIG. 7 shows an instantaneous position of this calibration method, in which the stop holder 40, which has been displaced in the positive x-direction compared with FIG. 6, has reached the first contact relative position of the calibration method relative to the stop end effector 45, in which the holder abutment body 42 is in defined contact with the calibration-object counter-abutment body 46.

This defined first contact relative position is reached with the aid of a step-by-step approaching method, as has already been explained above in connection with FIG. 4.

Figure 8:
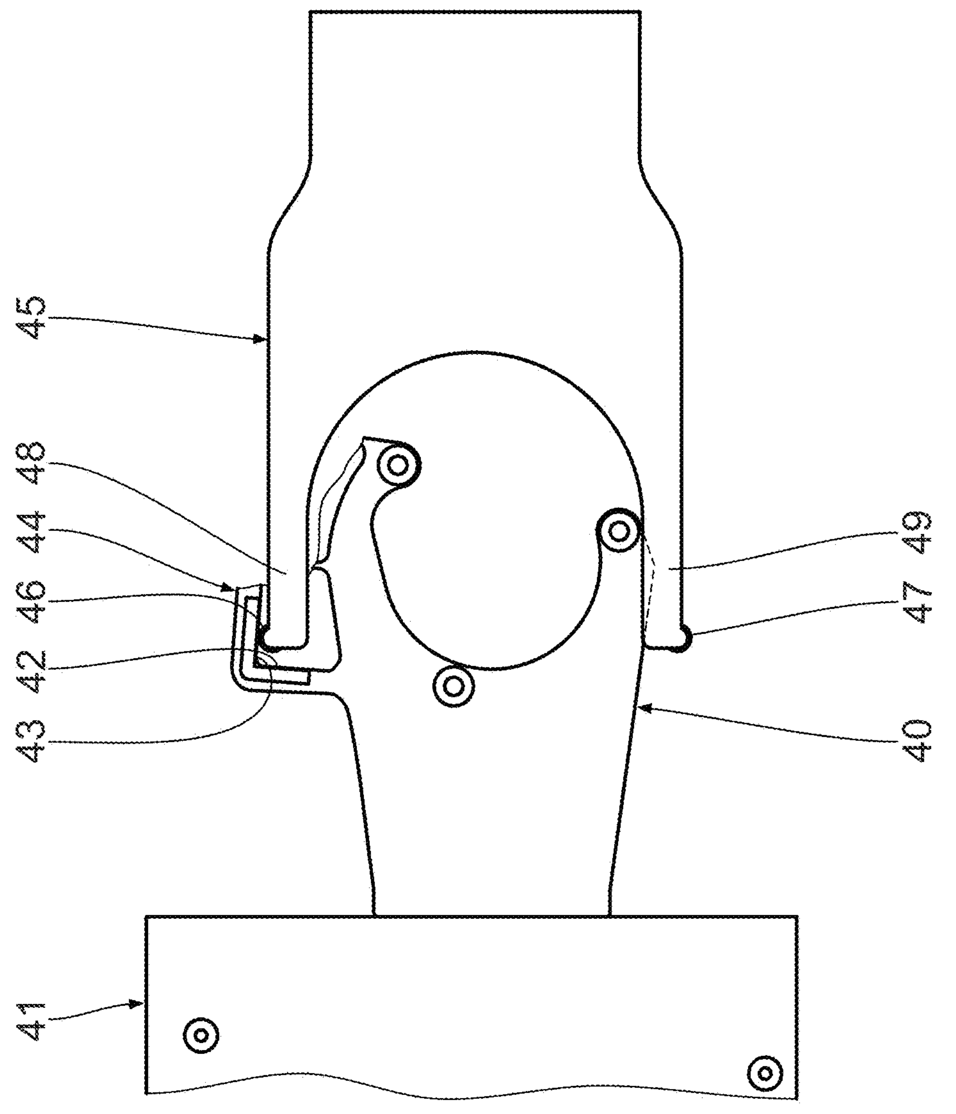
FIG. 8 shows in an illustration similar to FIG. 7 the stop end effector and the stop holder in a second contact relative position during the performance of the calibration method.

After this defined first contact relative position according to FIG. 7 has been reached and the position data thereof have been evaluated, the stop holder 40 is displaced in turn in a defined manner in the negative x-direction with the aid of the stop holder drive 41 and, thereafter, the stop holder 40 is displaced by use of the stop holder drive 41 in the negative y-direction until the second contact relative position has been reached, in which the holder abutment body 43 is in turn in contact with the calibration-object counter-abutment body 46 in a defined manner as shown in FIG. 8. In this second contact relative position, the y-position data of the stop holder 40 can then be evaluated, with the result that the xy-position of the stop holder 40 relative to the stop end effector 45 is then known for example with a position accuracy of +/−5 μm.

An accuracy of a calibration result can be better than 250 μm, in particular better than 100 μm along at least one of the translational degrees of freedom and better than 10 mrad, for example in the range of a few or one mrad along at least one of the rotational degrees of freedom.

Machine learning (ML) algorithms can be used in the calibration method. A neural network or artificial intelligence can also be used to optimize a displacement strategy during the calibration method. Rather than coil power, it is also possible to evaluate coil voltage or coil current.

Rather than a step-by-step displacement, a continuous displacement can also take place.

The number of holder abutment bodies can lie in the range between 1 and 10.

The number of calibration-object counter-abutment bodies can lie in the range between 1 and 10.

The metrology system furthermore has an EUV light source, which is not illustrated in more detail in the drawing. This can be a laser plasma source or a discharge source. Details of such plasma/discharge source are known from WO 2004/092693 and US 2022/0171292. The entire content of US 2022/0171292 is incorporated by reference. A discharge source is known from US 2014/0176005. A used wavelength of the EUV light source of the metrology system can lie in the range of between 5 nm and 30 nm.

In some implementations, the open-loop/closed-loop control device 13, or the evaluation unit, used to carry out the evaluation of the power data (e.g., coil power data) or coil voltage data or coil current data, and the computer used to carry out the evaluation of the position data, the evaluation of contact-sensor data, the evaluation of rotational displacement, the execution of the machine learning algorithms, the implementation of the neural network or artificial intelligence, and other data processing described above can be implemented using one or more computing devices that include one or more one or more data processors configured to execute one or more programs that include a plurality of instructions according to the principles described above.

The one or more computing devices can include one or more data processors for processing data, one or more storage devices for storing data, and/or one or more computer programs including instructions that when executed by the one or more computers cause the one or more computers to carry out the processes. The one or more computing devices can include one or more input devices, such as a keyboard, a mouse, a touchpad, and/or a voice command input module, and one or more output devices, such as a display, and/or an audio speaker. In some implementations, the one or more computing devices can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

A computer program can be written in any form of programming language, including compiled or interpreted languages, and it can be deployed in any form, including as a stand-alone program or as a module, component, subroutine, or other unit suitable for use in a computing environment.

For example, the one or more computing devices can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer system include one or more processors for executing instructions and one or more storage area devices for storing instructions and data. Generally, a computer system will also include, or be operatively coupled to receive data from, or transfer data to, or both, one or more machine-readable storage media, such as hard drives, magnetic disks, solid state drives, magneto-optical disks, or optical disks. Machine-readable storage media suitable for embodying computer program instructions and data include various forms of non-volatile storage area, including by way of example, semiconductor storage devices, e.g., EPROM, EEPROM, flash storage devices, and solid state drives; magnetic disks, e.g., internal hard disks or removable disks; magneto-optical disks; and CD-ROM, DVD-ROM, and/or Blu-ray discs.

In some implementations, the processes described above can be implemented using software for execution on one or more mobile computing devices, one or more local computing devices, and/or one or more remote computing devices (which can be, e.g., cloud computing devices). For instance, the software forms procedures in one or more computer programs that execute on one or more programmed or programmable computer systems, either in the mobile computing devices, local computing devices, or remote computing systems (which may be of various architectures such as distributed, client/server, grid, or cloud), each including at least one processor, at least one data storage system (including volatile and non-volatile memory and/or storage elements), at least one wired or wireless input device or port, and at least one wired or wireless output device or port.

In some implementations, the software may be provided on a medium, such as CD-ROM, DVD-ROM, Blu-ray disc, a solid state drive, or a hard drive, readable by a general or special purpose programmable computer or delivered (encoded in a propagated signal) over a network to the computer where it is executed. The functions can be performed on a special purpose computer, or using special-purpose hardware, such as coprocessors. The software can be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system can also be considered to be implemented as a computer-readable storage medium, configured with a computer program, where the storage medium so configured causes a computer system to operate in a specific and predefined manner to perform the functions described herein.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

While mechanical components may be described to have particular geometrical shapes and/or material properties, this should not be understood as requiring that such mechanical components to have the particular geometrical shapes and/or material properties described to achieve desirable results. Moreover, the separation of various system components in the embodiments described above should not be understood as requiring such separation in all embodiments.

For example, the calibration-object counter-abutment bodies 26 to 29 can be made from plastic material or from steel or other materials having properties to provide reproducible contact positions. For example, each of the calibration-object counter-abutment bodies 26 to 29 can have a spherical shape. Alternatively, the calibration-object counter-abutment bodies 26 to 29 may have another convex shape, e.g. a convex ellipsoidal or oval shape.

Thus, particular embodiments of the invention have been described. Other embodiments are within the scope of the following claims.

What is claimed is:

1. An interchangeable-object holding apparatus for an EUV metrology system for holding and providing an interchangeable object, which is intended to be used interchangeably within the EUV metrology system, having an interchangeable-object holder, which is drivably displaceable in a plurality of degrees of freedom of translation and/or rotation via at least one holder drive, having a calibration device for calibrating a relative position of the interchangeable object in the interchangeable-object holder with respect to a calibration object of the interchangeable-object holding apparatus, wherein the calibration device comprises:

at least one holder abutment body, which is secured to the interchangeable-object holder, at least one calibration-object counter-abutment body, which is secured to the calibration object, at least one contact sensor for detecting a contact between the holder abutment body and the calibration-object counter-abutment body, having an evaluation unit, which is in signal communication with the holder drive and the contact sensor, for determining the relative position of the interchangeable object in the interchangeable-object holder with respect to the calibration object from captured position and measurement data of the holder drive and of the contact sensor.

2. The interchangeable-object holding apparatus of claim 1, wherein the interchangeable-object holder is a measurement-object holder for holding a measurement object that is to be measured using the EUV metrology system or is a stop holder for holding a stop for specifying illumination or imaging parameters of an optical system of the metrology system.

3. The interchangeable-object holding apparatus of claim 1, wherein the holding drive is designed as an electromagnetic holding drive, wherein the contact sensor is configured as a measurement unit for measuring a power consumed by the electromagnetic holding drive.

4. The interchangeable-object holding apparatus of claim 1, wherein the calibration object is an end effector of a robot arm of a mechatronic positioning system via which the interchangeable object is feedable to the interchangeable-object holder.

5. The interchangeable-object holding apparatus of claim 1, wherein the calibration device has a plurality of the holder abutment bodies, which are arranged at a distance from one another.

6. The interchangeable-object holding apparatus of claim 5, wherein the holder abutment bodies and/or the calibration-object counter-abutment bodies are mounted such that they interact with the respective calibration-object counter-abutment body and/or with the respective holder abutment body during a displacement of the interchangeable-object holder and/or of the calibration object along various ones of the translation and/or rotation degrees of freedom.

7. A method for calibrating an interchangeable-object holding apparatus having a calibration device according to claim 1, having the following steps:

displacing the interchangeable-object holder relative to the calibration object along a first translational degree of freedom until a first contact relative position, defined via detection of a contact by use of the contact sensor and via the contact sensor data captured by the evaluation unit, between one of the holder abutment bodies of the interchangeable-object holder and one of the calibration-object counter-abutment bodies has been attained, and evaluating the position data of the holder drive in the first contact relative position.

8. The method of claim 7, having the following further steps:

displacing the interchangeable-object holder relative to the calibration object along a second translational degree of freedom until a second contact relative position, defined via detection of a contact by use of the contact sensor and via the contact sensor data captured by the evaluation unit, between one of the holder abutment bodies and the calibration-object counter-abutment body has been attained, and evaluating the position data of the holder drive in the second contact relative position.

9. The method of claim 7, having the following further steps:

displacing the interchangeable-object holder relative to the calibration object by one rotational degree of freedom between two translational displacements, evaluating the positional change of the interchangeable-object holder that occurred during the rotational displacement by capturing corresponding holder-drive position data.

10. The method of claim 7, wherein the displacement takes place step-by-step.

11. The method of claim 10, wherein a defined contact relative position is attained by displacement with step widths of different sizes.

12. An EUV metrology system having an interchangeable-object holding apparatus according to claim 1, having an EUV light source, having an optical system, having:

an illumination optical unit for illuminating an object field in which a section of a measurement object to be examined can be arranged, a projection optical unit for imaging the object field into an image field, and a spatially resolved detection device arranged in the image field.

13. The EUV metrology system of claim 12, comprising a mechatronic positioning system having a robot arm with an end effector which simultaneously represents a calibration object of the interchangeable-object holding apparatus.

14. The EUV metrology system of claim 12, wherein the interchangeable-object holder is a measurement-object holder for holding a measurement object that is to be measured using the EUV metrology system or is a stop holder for holding a stop for specifying illumination or imaging parameters of an optical system of the metrology system.

15. The EUV metrology system of claim 12, wherein the holding drive is designed as an electromagnetic holding drive, and the contact sensor is configured as a measurement unit for measuring a power consumed by the electromagnetic holding drive.

16. The EUV metrology system of claim 12, wherein the calibration object is an end effector of a robot arm of a mechatronic positioning system via which the interchangeable object is feedable to the interchangeable-object holder.

17. The EUV metrology system of claim 12, wherein the calibration device has a plurality of the holder abutment bodies that are arranged at a distance from one another.

18. The method of claim 7, wherein the interchangeable-object holder is a measurement-object holder for holding a measurement object that is to be measured using the EUV metrology system or is a stop holder for holding a stop for specifying illumination or imaging parameters of an optical system of the metrology system.

19. The method of claim 7, wherein the holding drive is designed as an electromagnetic holding drive, and the contact sensor is configured as a measurement unit for measuring a power consumed by the electromagnetic holding drive.

20. The method of claim 7, wherein the calibration object is an end effector of a robot arm of a mechatronic positioning system via which the interchangeable object is feedable to the interchangeable-object holder.

21. The interchangeable-object holding apparatus of claim 1 wherein at least one of the at least one calibration-object counter-abutment body has a spherical abutment surface having a radius of curvature in a range from 10 mm to 100 mm, and a corresponding holder abutment body has a planar abutment surface.

* * * * *